(12) United States Patent
Lee et al.

(10) Patent No.: US 8,779,562 B2
(45) Date of Patent: Jul. 15, 2014

(54) INTEGRATED CIRCUIT PACKAGING SYSTEM WITH INTERPOSER SHIELD AND METHOD OF MANUFACTURE THEREOF

(75) Inventors: SeongMin Lee, Seoul (KR); Sungmin Song, Inchon (KR); SeongHun Mun, Incheon (KR)

(73) Assignee: STATS ChipPAC Ltd., Singapore (SG)

( * ) Notice: Subject to any disclaimer, the term of this patent is extended or adjusted under 35 U.S.C. 154(b) by 11 days.

(21) Appl. No.: 13/071,228

(22) Filed: Mar. 24, 2011

(65) Prior Publication Data
US 2012/0241921 A1 Sep. 27, 2012

(51) Int. Cl.
*H01L 23/552* (2006.01)
*H01L 23/31* (2006.01)
*H01L 25/10* (2006.01)

(52) U.S. Cl.
USPC ........... 257/659; 438/107; 438/124; 257/686; 257/725; 257/728; 257/777

(58) Field of Classification Search
USPC ............................ 257/659, 660; 438/109, 107
See application file for complete search history.

(56) References Cited

U.S. PATENT DOCUMENTS

| 7,728,417 | B2 | 6/2010 | Karnezos |
| 7,898,072 | B2 | 3/2011 | Kim et al. |
| 8,129,824 | B1 * | 3/2012 | St. Amand et al. ........... 257/659 |
| 2007/0096335 | A1 * | 5/2007 | Kwon et al. ................... 257/777 |
| 2008/0284002 | A1 | 11/2008 | Camacho et al. |
| 2009/0108428 | A1 * | 4/2009 | Carson et al. ................. 257/686 |
| 2009/0321898 | A1 | 12/2009 | Pagaila et al. |
| 2010/0007000 | A1 * | 1/2010 | Kim et al. ..................... 257/686 |
| 2010/0244222 | A1 | 9/2010 | Chi et al. |
| 2010/0244223 | A1 * | 9/2010 | Cho et al. ...................... 257/690 |
| 2011/0199735 | A1 * | 8/2011 | Kawabata ...................... 361/721 |

FOREIGN PATENT DOCUMENTS

WO  WO 2011024333 A1 *  3/2011

* cited by examiner

*Primary Examiner* — Olik Chaudhuri
*Assistant Examiner* — Christine Enad
(74) *Attorney, Agent, or Firm* — Ishimaru & Associates LLP

(57) ABSTRACT

A method of manufacture of an integrated circuit packaging system includes: providing a bottom substrate; attaching a first integrated circuit die to the bottom substrate; forming an interposer including: forming an intermediate substrate; forming a shield on the intermediate substrate; and applying a wire-in-film adhesive to the shield; and attaching the interposer to the first integrated circuit die with the wire-in-film adhesive.

18 Claims, 4 Drawing Sheets

INTEGRATED CIRCUIT PACKAGING SYSTEM WITH INTERPOSER SHIELD AND METHOD OF MANUFACTURE THEREOF

TECHNICAL FIELD

The present invention relates generally to an integrated circuit packaging system, and more particularly to a system for utilizing an interposer shield in an integrated circuit packaging system.

BACKGROUND ART

Integrated circuit packaging technology has seen an increase in the number of integrated circuits mounted on/over a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, computer servers, and storage servers, need more integrated circuits in the same or smaller "real estate".

Particularly acute, the needs for portable personal electronics, such as cell phones, digital cameras, music players, personal digital assistances, and location-based devices, have further driven the need for integrated circuit density. Modem portable electronic devices require a seamless integration of analog and digital subsystems. High-speed digital systems may switch at a high rate, such as more than one gigahertz. At such switching speeds, switching currents radiate energy (noise) that interferes with sensitive analog circuits or even other digital circuits. Interference usually takes the form of signal crosstalk.

Electromagnetic interference (EMI) is a generic term for unwanted interference energies either conducted as currents or radiated as electromagnetic fields. As electronic devices and integrated circuits operate at higher and higher frequencies, EMI extends into the radio frequency spectrum and can cause significant interference with radio and television signals.

One typical scheme has been to provide a conductive enclosure to an electronic device so that EMI field lines will terminate on such enclosure. Unfortunately, conductive enclosures that contain the entire product or parts of the product can be very expensive. In addition, the need to increase integrated circuit density has led to the development of multi-chip packages in which more than one integrated circuit can be packaged.

The trend is to pack more integrated circuits and different types of integrated circuits into a single package require EMI shielding within the package. Typically, metallic or conductive enclosures isolate the various integrated circuits from each other in a package. These conductive enclosures must also be grounded so the EMI radiated energy may be absorbed by the system as opposed to being radiated into the environment or to other integrated circuits. These solutions add manufacture complexity, manufacturing cost, and hamper the size reduction of the multi-chip packages.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a bottom substrate; attaching a first integrated circuit die to the bottom substrate; forming an interposer including: forming an intermediate substrate; forming a shield on the intermediate substrate; and applying a wire-in-film adhesive to the shield; and attaching the interposer to the first integrated circuit die with the wire-in-film adhesive.

The present invention provides an integrated circuit packaging system, including: a bottom substrate; a first integrated circuit die attached to the bottom substrate; and an interposer mounted on the first integrated circuit die with a wire-in-film adhesive, the interposer having an intermediate substrate, a shield on the intermediate substrate, and the wire-in-film adhesive between the first integrated circuit die and the shield.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
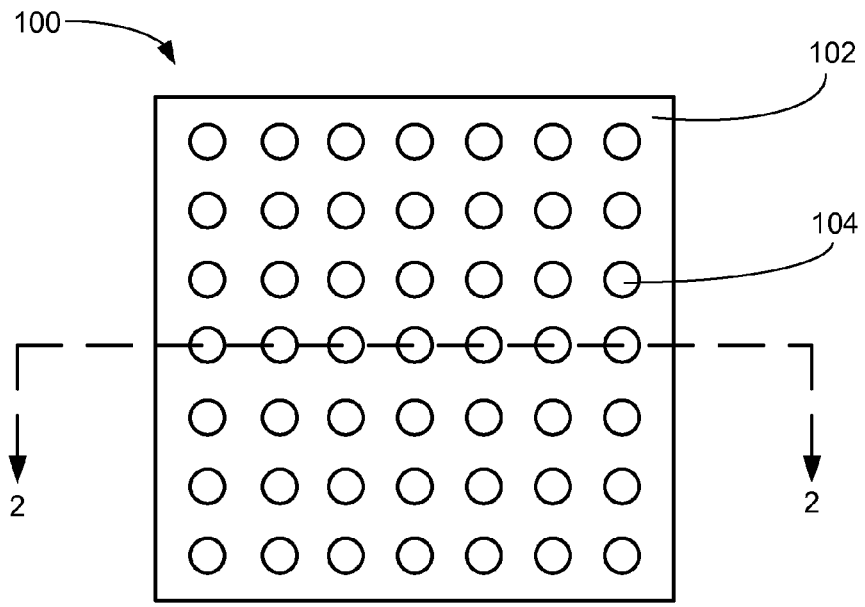
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the interposer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in a first embodiment of the present invention. The integrated circuit packaging system 100 is shown having a bottom substrate 102, such as a laminated plastic or ceramic substrate, and external interconnects 104. The external interconnects 104 physically and electrically connect the integrated circuit packaging system 100 to a next level system or other package. The external interconnects 104 can be connectors such as solder balls or bumps.

Figure 2:
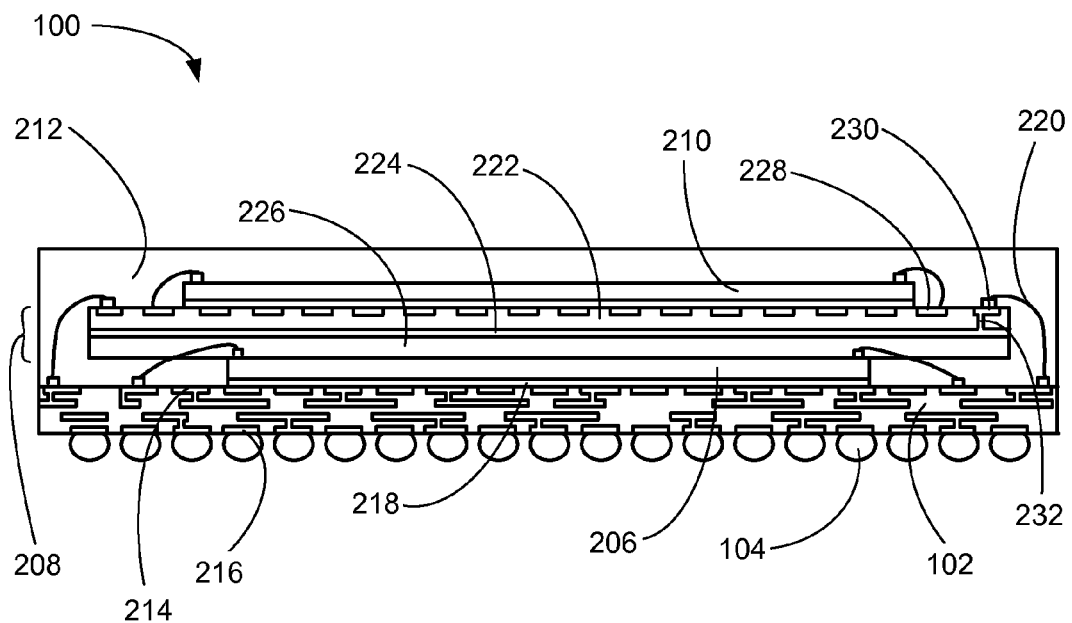
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having the bottom substrate 102 of FIG. 1, such as a laminated plastic or ceramic substrate, the external interconnects 104 of FIG. 1, a first integrated circuit die 206, an interposer 208, a second integrated circuit die 210, and an encapsulation 212.

The bottom substrate 102 has top contact pads 214, bottom contact pads 216, and the external interconnects 104. The bottom substrate 102 can include a conductive pattern that connects the top contact pads 214 to the bottom contact pads 216. The bottom contact pads 216 can connect to ground or to a next level system (not shown) through the external interconnects 104. The external interconnects 104 can be connectors such as solder balls formed on the bottom contact pads 216.

The first integrated circuit die 206 can be mounted on the bottom substrate 102. The first integrated circuit die 206 can be a die that emits signals such as a radio frequency (RF) die. The first integrated circuit die 206 can be mounted on the bottom substrate 102 in a number of ways. For example, the first integrated circuit die 206 can be a wire-bond die attached to the bottom substrate 102 with a die-attach adhesive 218 and bond wires 220. Also for example, the first integrated circuit die 206 can be a flip chip and mounted on the bottom substrate 102 with solder balls.

Mounted on the first integrated circuit die 206 is the interposer 208, as an example. The interposer 208 can be larger than the first integrated circuit die 206 to shield other components from EMI from the first integrated circuit die 206. The interposer 208 has an intermediate substrate 222, a shield 224 formed on the intermediate substrate 222, and a wire-in-film adhesive 226 applied to the shield 224. The interposer 208 mounted on the first integrated circuit die 206 can be used as a redistribution layer for a device mounted on the opposite side of the interposer 208 from the first integrated circuit die 206. The top contact pads 214 can directly connect to the first integrated circuit die 206 or to the interposer 208.

The interposer 208 can be manufactured in a large sheet. For example, the intermediate substrate 222 can be formed, and the shield 224 deposited on the intermediate substrate 222 by a process such as plating, sputtering, or chemical vapor deposition (CVD).

The wire-in-film adhesive 226 can be applied to the shield 224, and then the individual units of the interposer 208 can be singulated by a process such as sawing. The vertical edges of the wire-in-film adhesive 226, the shield 224, and the intermediate substrate 222 are all coplanar because of the method of manufacture.

For illustrative purposes, the wire-in-film adhesive 226 is described as being applied to the shield 224 before singulation, but it is understood that the wire-in-film adhesive 226 can be applied after singulation as well. For example, the wire-in-film adhesive 226 can be applied to the shield 224 after singulation such that the vertical edges of the wire-in-film adhesive 226 and the shield 224 are coplanar.

The intermediate substrate 222 can have upper contact pads 228 on the top surface of the intermediate substrate 222 and a ground contact pad 230 that is electrically connected to a via 232 that extends through the intermediate substrate 222. The upper contact pads 228 and the ground contact pad 230 can be coplanar with the surface of the intermediate substrate 222.

The intermediate substrate 222 can be formed in different ways. For example, the intermediate substrate 222 can contain a redistribution layer. As a further example, the intermediate substrate 222 can be formed with the entire top surface being flat.

The shield 224 preferably functions as an electromagnetic interference (EMI) shield and a noise suppression structure between the first integrated circuit die 206 and the second integrated circuit die 210. The shield 224 preferably includes conductive materials such as a conductive metal or conductive paste. The shield 224 has noise deterrence properties through the use of the physical properties of magnetic or inductive materials. The materials of the shield 224 preferably possess inductive properties for EMI suppression and resistive properties for EMI absorption providing an overall result of radiation attenuation.

The shield 224 can be applied to the intermediate substrate 222 by plating on the intermediate substrate 222. The shield 224 can extend to the edge of the intermediate substrate 222. The shield 224 can be deposited or plated on the via 232 which can extend through the intermediate substrate 222 and is in electrical contact with the ground contact pad 230 on the upper surface of the intermediate substrate 222. The shield 224 can be grounded by wire-bonding the ground contact pad 230 to the top contact pads 214 of the bottom substrate 102 with the bond wires 220.

It has been discovered that the shield 224 being formed as part of the interposer 208 allows for a reduction in the equipment necessary for manufacturing. For example, because the shield 224 is plated directly on the intermediate substrate 222, equipment for mounting a metal shield is unnecessary. Also for example, there is no need for additional processing to attach a metal shield such as applying an extra layer of adhesive.

The wire-in-film adhesive 226 is an adhesive applied to the shield 224 for attaching the interposer 208 to another component. The wire-in-film adhesive 226 can be used to attach the interposer 208 to the first integrated circuit die 206. The wire-in-film adhesive 226 has a low viscosity and as temperature increases the viscosity gets lower. The wire-in-film adhesive 226 can be pressed over the first integrated circuit die 206 and the bond wires 220 and then cured to harden the wire-in-film adhesive 226.

The wire-in-film adhesive 226 is a thermally conductive dielectric material. The wire-in-film adhesive 226 can be made of a B-stage material, such as a B-stage epoxy, that can be hardened after curing and can maintain a predetermined thickness. The wire-in-film adhesive 226 functions as a spacer between the first integrated circuit die 206 and the shield 224, and also serves to protect the bond wires 220 attached to the first integrated circuit die 206 from mechanical damage. The wire-in-film adhesive 226 also functions to prevent the bond wires 220 from a short by preventing them from contacting other bond wires 220 or the shield 224.

It has been discovered that the shield 224 being formed as part of the interposer 208 and attaching the interposer 208 to the first integrated circuit die 206 directly with the wire-in-film adhesive 226 allows for a reduction in height of the final package. Additionally, it has been discovered that the reduction in processing and manufacturing steps also can lead to a reduction in cost of manufacture.

Thus, it has been discovered that the integrated circuit packaging system of the present invention furnishes important and heretofore unknown and unavailable solutions, capabilities, and functional aspects for a method of manufacture of the integrated circuit packaging system with interposer shield.

The second integrated circuit die 210 can be mounted over the interposer 208 and connected to the upper contact pads 228 of the interposer 208. The second integrated circuit die 210 can be connected directly to the upper contact pads 228.

The second integrated circuit die 210 can be mounted over the interposer 208 and connected to the upper contact pads of the interposer 208 before the top surface of the bottom substrate 102, the first integrated circuit die 206, and the interposer are covered by the encapsulation 212. The encapsulation 212 can be molded to also cover the upper contact pads 228, the bond wires 220, and the second integrated circuit die 210. The encapsulation 212, such as film assisted molding, epoxy molding, or some type of plastic, protects sensitive components from moisture, dust and other contamination.

Figure 3:
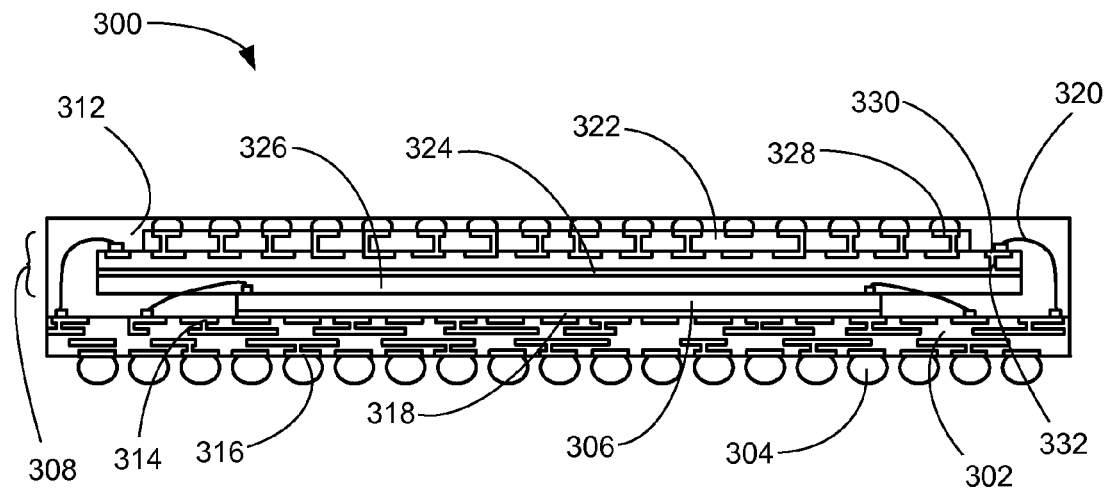
FIG. 3 is a cross-sectional view of the integrated circuit packaging system along the line 2-2 of FIG. 1 in a second embodiment of the present invention.

Referring now to FIG. 3, therein is shown a cross-sectional view of the integrated circuit packaging system 300 along the line 2-2 of FIG. 1 in a second embodiment of the present invention. The integrated circuit packaging system 300 is shown having the bottom substrate 302, such as a laminated plastic or ceramic substrate, external interconnects 304, a first integrated circuit die 306, an interposer 308, and an encapsulation 312.

The bottom substrate 302 has top contact pads 314, bottom contact pads 316, and the external interconnects 304. The bottom substrate 302 can include a conductive pattern that connects the top contact pads 314 to the bottom contact pads 316. The bottom contact pads 316 can connect to ground or to a next level system (not shown) through the external interconnects 304. The external interconnects 304 can be connectors such as solder balls formed on the bottom contact pads 316.

The first integrated circuit die 306 can be mounted on the bottom substrate 302. The first integrated circuit die 306 can be a die that emits signals such as a radio frequency (RF) die. The first integrated circuit die 306 can be mounted on the bottom substrate 302 in a number of ways. For example, the first integrated circuit die 306 can be a wire-bond die attached to the bottom substrate 302 with a die-attach adhesive 318 and bond wires 320. Also for example, the first integrated circuit die 306 can be a flip chip and mounted on the bottom substrate 302 with solder balls.

Mounted on the first integrated circuit die 306 is the interposer 308, as an example. The interposer 308 can be larger than the first integrated circuit die 306 to shield other components from EMI from the first integrated circuit die 306. The interposer 308 has an intermediate substrate 322, a shield 324 formed on the intermediate substrate 322, and a wire-in-film adhesive 326 applied to the shield 324. The interposer 308 mounted on the first integrated circuit die 306 can be used as a redistribution layer for a device mounted on the opposite side of the interposer 308 from the first integrated circuit die 306. The top contact pads 314 can directly connect to the first integrated circuit die 306 or to the interposer 308.

The interposer 308 can be manufactured in a large sheet. For example, the intermediate substrate 322 can be formed, and the shield 324 deposited on the intermediate substrate 322 by a process such as plating, sputtering, or chemical vapor deposition (CVD).

The wire-in-film adhesive 326 can be applied to the shield 324, and then the individual units of the interposer 308 can be singulated by a process such as sawing. The vertical edges of the wire-in-film adhesive 326, the shield 324, and the intermediate substrate 322 are all coplanar because of the method of manufacture.

The intermediate substrate 322 can have upper contact pads 328 on the top surface of the intermediate substrate 322 and a ground contact pad 330 that is electrically connected to a via 332 that extends through the intermediate substrate 322. The upper contact pads 328 and the ground contact pad 330 can be coplanar with the surface of the intermediate substrate 322.

The intermediate substrate 322 can be formed in different ways. For example, the intermediate substrate 322 can contain a redistribution layer. As a further example, the intermediate substrate 322 can be formed with the entire top surface being flat.

Also for example, the intermediate substrate 322 can be formed as a step-down substrate, which has the edges of the intermediate substrate 322 at a lower height than the top surface of the intermediate substrate 322 to help prevent mold flash from contaminating exposed contacts, such as the upper contact pads 328.

The intermediate substrate 322 formed as a step-down substrate can be formed through a number of processes. For example, the step-down substrate can be formed using a saw that cuts the edge of the intermediate substrate 322 to a predetermined depth without cutting through the intermediate substrate 322. Also for example, the step-down substrate can be formed by drilling or etching. The external interconnects 304 can be formed on the upper contact pads 328 for connection to other integrated circuit devices.

The shield 324 preferably functions as an electromagnetic interference (EMI) shield and a noise suppression structure between the first integrated circuit die 306 and other devices. The shield 324 preferably includes conductive materials such as a conductive metal or conductive paste. The shield 324 has noise deterrence properties through the use of the physical properties of magnetic or inductive materials. The materials of the shield 324 preferably possess inductive properties for EMI suppression and resistive properties for EMI absorption providing an overall result of radiation attenuation.

The shield 324 can be applied to the intermediate substrate 322 by plating on the intermediate substrate 322. The shield 324 can extend to the edge of the intermediate substrate 322. The shield 324 can be deposited or plated on the via 332 which can extend through the intermediate substrate 322 and is in electrical contact with the ground contact pad 330 on the upper surface of the intermediate substrate 322. The shield 324 can be grounded by wire-bonding the ground contact pad 330 to the top contact pads 314 of the bottom substrate 302 with the bond wires 320.

It has been discovered that the shield 324 being formed as part of the interposer 308 allows for a reduction in the equipment necessary for manufacturing. For example, because the shield 324 is plated directly on the intermediate substrate 322, equipment for mounting a metal shield is unnecessary. Also for example, there is no need for additional processing to attach a metal shield such as applying an extra layer of adhesive.

The wire-in-film adhesive 326 is an adhesive applied to the shield 324 for attaching the interposer 308 to another component. The wire-in-film adhesive 326 can be used to attach the interposer 308 to the first integrated circuit die 306. The wire-in-film adhesive 326 has a low viscosity and as temperature increases the viscosity gets lower. The wire-in-film adhesive 326 can be pressed over the first integrated circuit die 306 and the bond wires 320 and then cured to harden the wire-in-film adhesive 326.

The wire-in-film adhesive 326 is a thermally conductive dielectric material. The wire-in-film adhesive 326 can be made of a B-stage material, such as a B-stage epoxy, that can be hardened after curing and can maintain a predetermined thickness. The wire-in-film adhesive 326 functions as a spacer between the first integrated circuit die 306 and the shield 324, and also serves to protect the bond wires 320 attached to the first integrated circuit die 306 from mechanical damage. The wire-in-film adhesive 326 also functions to prevent the bond wires 320 from a short by preventing them from contacting other bond wires 320 or the shield 324.

It has been discovered that the shield 324 being formed as part of the interposer 308 and attaching the interposer 308 to the first integrated circuit die 306 directly with the wire-in-film adhesive 326 allows for a reduction in height of the final package. Additionally, it has been discovered that the reduction in processing and manufacturing steps also can lead to a reduction in cost of manufacture.

Thus, it has been discovered that the integrated circuit packaging system of the present invention furnishes important and heretofore unknown and unavailable solutions, capabilities, and functional aspects for a method of manufacture of the integrated circuit packaging system with interposer shield.

The encapsulation 312 can be molded to cover the top surface of the bottom substrate 302, the first integrated circuit die 306, the interposer 308, the upper contact pads 328, and the bond wires 320. The encapsulation 312, such as film assisted molding, epoxy molding, or some type of plastic, protects sensitive components from moisture, dust and other contamination. The encapsulation 312 completely covers vertical sidewalls of the step-down substrate. The encapsulation 312 can be planarized so as to expose the external interconnects 304 on the upper contact pads 328 on the interposer 308 for connection to other devices.

Figure 4:
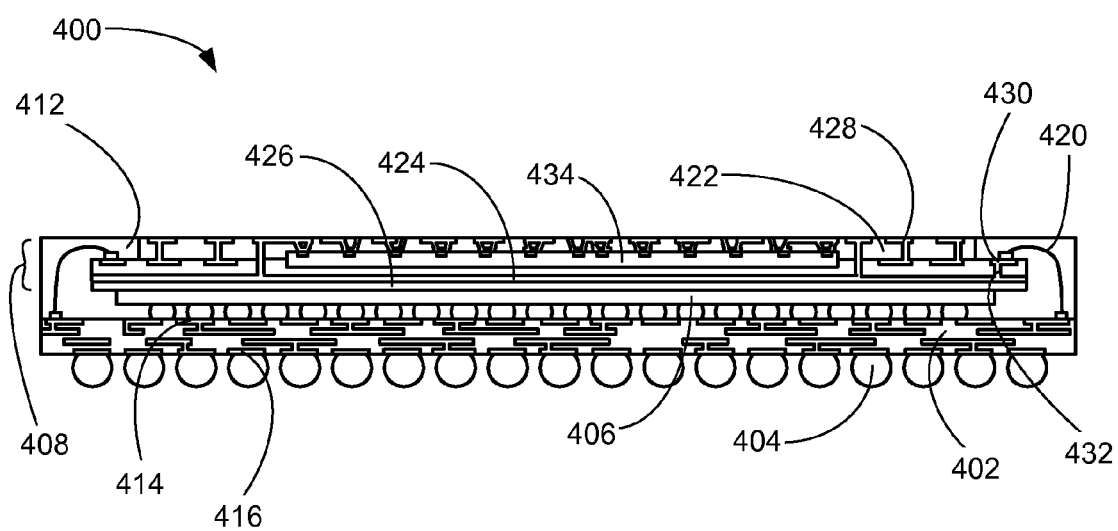
FIG. 4 is a cross-sectional view of the integrated circuit packaging system along the line 2-2 of FIG. 1 in a third embodiment of the present invention.

Referring now to FIG. 4, therein is shown a cross-sectional view of the integrated circuit packaging system 400 along the line 2-2 of FIG. 1 in a third embodiment of the present invention. The integrated circuit packaging system 400 is shown having the bottom substrate 402, such as a laminated plastic or ceramic substrate, external interconnects 404, a first integrated circuit die 406, an interposer 408, and an encapsulation 412.

The bottom substrate 402 has top contact pads 414, bottom contact pads 416, and the external interconnects 404. The bottom substrate 402 can include a conductive pattern that connects the top contact pads 414 to the bottom contact pads 416. The bottom contact pads 416 can connect to ground or to a next level system (not shown) through the external interconnects 404. The external interconnects 404 can be connectors such as solder balls formed on the bottom contact pads 416.

The first integrated circuit die 406 can be mounted on the bottom substrate 402. The first integrated circuit die 406 can be a die that emits signals such as a radio frequency (RF) die. The first integrated circuit die 406 can be mounted on the bottom substrate 402 in a number of ways. For example, the first integrated circuit die 406 can be a flip chip and mounted on the bottom substrate 402 with solder balls.

Mounted on the first integrated circuit die 406 is the interposer 408, as an example. The interposer 408 can be larger than the first integrated circuit die 406 to shield other components from EMI from the first integrated circuit die 406. The interposer 408 has an intermediate substrate 422, a shield 424 formed on the intermediate substrate 422, and a wire-in-film adhesive 426 applied to the shield 424. The interposer 408 mounted on the first integrated circuit die 406 can be used as a redistribution layer for a device mounted on the opposite side of the interposer 408 from the first integrated circuit die 406. The top contact pads 414 can directly connect to the first integrated circuit die 406 or to the interposer 408.

The interposer 408 can be manufactured in a large sheet. For example, the intermediate substrate 422 can be formed, and the shield 424 deposited on the intermediate substrate 422 by a process such as plating, sputtering, or chemical vapor deposition (CVD).

The wire-in-film adhesive 426 can be applied to the shield 424, and then the individual units of the interposer 408 can be singulated by a process such as sawing. The vertical edges of the wire-in-film adhesive 426, the shield 424, and the intermediate substrate 422 are all coplanar because of the method of manufacture.

The intermediate substrate 422 can have upper contact pads 428 on the top surface of the intermediate substrate 422 and a ground contact pad 430 that is electrically connected to a via 432 that extends through the intermediate substrate 422. The upper contact pads 428 and the ground contact pad 430 can be coplanar with the surface of the intermediate substrate 422.

The intermediate substrate 422 can be formed in different ways. For example, the intermediate substrate 422 can contain a redistribution layer. As a further example, the intermediate substrate 422 can be formed with the entire top surface being flat.

Also for example, the intermediate substrate 422 can be formed as a step-down substrate, which has the edges of the intermediate substrate 422 at a lower height than the top surface of the intermediate substrate 422 to help prevent mold flash from contaminating exposed contacts, such as the upper contact pads 428.

The intermediate substrate 422 formed as a step-down substrate can be formed through a number of processes such as using a saw that cuts the edge of the intermediate substrate 422 to a predetermined depth without cutting through the intermediate substrate 422. The external interconnects 404 can be formed on the upper contact pads 428 for connection to other integrated circuit devices.

The intermediate substrate 422 can contain an embedded die 434, which is entirely inside the intermediate substrate 422. The embedded die 434 can connect to the upper contact pads 428 through internal interconnects. The embedded die 434 can be placed in the intermediate substrate 422 during manufacture of the intermediate substrate 422 in a number of ways. For example, during manufacture of the intermediate substrate 422, a recess can be cut in the bottom layers for the embedded die 434, and then the top layers of the intermediate substrate 422 can be formed over the bottom layers and the embedded die 434.

For illustrative purposes, the embedded die 434 is described as being embedded in the intermediate substrate 422 in a particular way though it is understood that other processes can be used. For example, the embedded die 434 can be attached to a bottom substrate and covered with a solder resist or a top substrate in such a way as to leave electrical connections on the top surface. As an optional step, a step-down substrate can be formed by a process such as sawing, drilling, or etching. The intermediate substrate 422 with the embedded die 434 can then be singulated.

The shield 424 preferably functions as an electromagnetic interference (EMI) shield and a noise suppression structure between the first integrated circuit die 406 and other devices. The shield 424 preferably includes conductive materials such as a conductive metal or conductive paste. The shield 424 has noise deterrence properties through the use of the physical properties of magnetic or inductive materials. The materials of the shield 424 preferably possess inductive properties for EMI suppression and resistive properties for EMI absorption providing an overall result of radiation attenuation.

The shield 424 can be applied to the intermediate substrate 422 by plating on the intermediate substrate 422. The shield 424 can extend to the edge of the intermediate substrate 422. The shield 424 can be deposited or plated on the via 432 which can extend through the intermediate substrate 422 and is in electrical contact with the ground contact pad 430 on the upper surface of the intermediate substrate 422. The shield 424 can be grounded by wire-bonding the ground contact pad 430 to the top contact pads 414 of the bottom substrate 402 with the bond wires 420.

It has been discovered that the shield 424 being formed as part of the interposer 408 allows for a reduction in the equipment necessary for manufacturing. For example, because the shield 424 is plated directly on the intermediate substrate 422, equipment for mounting a metal shield is unnecessary. Also for example, there is no need for additional processing to attach a metal shield such as applying an extra layer of adhesive.

The wire-in-film adhesive 426 is an adhesive applied to the shield 424 for attaching the interposer 408 to another component. The wire-in-film adhesive 426 can be used to attach the interposer 408 to the first integrated circuit die 406. The wire-in-film adhesive 426 has a low viscosity and as temperature increases the viscosity gets lower. The wire-in-film adhesive 426 can be pressed over the first integrated circuit die 406 and the bond wires 420 and then cured to harden the wire-in-film adhesive 426.

The wire-in-film adhesive 426 is a thermally conductive dielectric material. The wire-in-film adhesive 426 can be made of a B-stage material, such as a B-stage epoxy, that can be hardened after curing and can maintain a predetermined thickness. The wire-in-film adhesive 426 functions as a spacer between the first integrated circuit die 406 and the shield 424, and also serves to protect the bond wires 420 attached to the first integrated circuit die 406 from mechanical damage. The wire-in-film adhesive 426 also functions to prevent the bond wires 420 from a short by preventing them from contacting other bond wires 420 or the shield 424.

It has been discovered that the shield 424 being formed as part of the interposer 408 and attaching the interposer 408 to the first integrated circuit die 406 directly with the wire-in-film adhesive 426 allows for a reduction in height of the final package. Additionally, it has been discovered that the reduction in processing and manufacturing steps also can lead to a reduction in cost of manufacture.

Thus, it has been discovered that the integrated circuit packaging system of the present invention furnishes important and heretofore unknown and unavailable solutions, capabilities, and functional aspects for a method of manufacture of the integrated circuit packaging system with interposer shield.

The encapsulation 412 can be molded to cover the top surface of the bottom substrate 402, the first integrated circuit die 406, the interposer 408, the upper contact pads 428, and the bond wires 420. The encapsulation 412, such as film assisted molding, epoxy molding, or some type of plastic, protects sensitive components from moisture, dust and other contamination.

Figure 5:
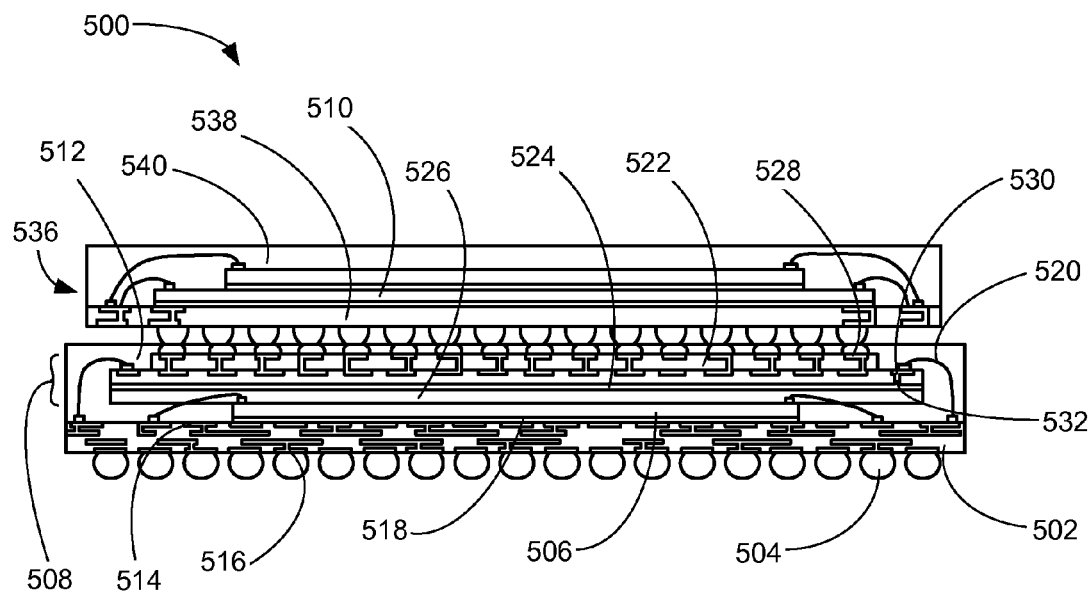
FIG. 5 is a cross-sectional view of the integrated circuit packaging system along the line 2-2 of FIG. 1 in a fourth embodiment of the present invention.

Referring now to FIG. 5, therein is shown a cross-sectional view of the integrated circuit packaging system 500 along the line 2-2 of FIG. 1 in a fourth embodiment of the present invention. The integrated circuit packaging system 500 is shown having the bottom substrate 502, such as a laminated plastic or ceramic substrate, external interconnects 504, a first integrated circuit die 506, an interposer 508, a second integrated circuit die 510, and an encapsulation 512, and an integrated circuit device 536.

The bottom substrate 502 has top contact pads 514, bottom contact pads 516, and the external interconnects 504. The bottom substrate 502 can include a conductive pattern that connects the top contact pads 514 to the bottom contact pads 516. The bottom contact pads 516 can connect to ground or to a next level system (not shown) through the external interconnects 504. The external interconnects 504 can be connectors such as solder balls formed on the bottom contact pads 516.

The first integrated circuit die 506 can be mounted on the bottom substrate 502. The first integrated circuit die 506 can be a die that emits signals such as a radio frequency (RF) die. The first integrated circuit die 506 can be mounted on the bottom substrate 502 in a number of ways. For example, the first integrated circuit die 506 can be a wire-bond die attached to the bottom substrate 502 with a die-attach adhesive 518 and bond wires 520. Also for example, the first integrated circuit die 506 can be a flip chip and mounted on the bottom substrate 502 with solder balls.

Mounted on the first integrated circuit die 506 is the interposer 508, as an example. The interposer 508 can be larger than the first integrated circuit die 506 to shield other components from EMI from the first integrated circuit die 506. The interposer 508 has an intermediate substrate 522, a shield 524 formed on the intermediate substrate 522, and a wire-in-film adhesive 526 applied to the shield 524. The interposer 508 mounted on the first integrated circuit die 506 can be used as a redistribution layer for a device mounted on the opposite side of the interposer 508 from the first integrated circuit die

506. The top contact pads 514 can directly connect to the first integrated circuit die 506 or to the interposer 508.

The interposer 508 can be manufactured in a large sheet. For example, the intermediate substrate 522 can be formed, and the shield 524 deposited on the intermediate substrate 522 by a process such as plating, sputtering, or chemical vapor deposition (CVD).

The wire-in-film adhesive 526 can be applied to the shield 524, and then the individual units of the interposer 508 can be singulated by a process such as sawing. The vertical edges of the wire-in-film adhesive 526, the shield 524, and the intermediate substrate 522 are all coplanar because of the method of manufacture.

The intermediate substrate 522 can have upper contact pads 528 on the top surface of the intermediate substrate 522 and a ground contact pad 530 that is electrically connected to a via 532 that extends through the intermediate substrate 522. The upper contact pads 528 and the ground contact pad 530 can be coplanar with the surface of the intermediate substrate 522.

The intermediate substrate 522 can be formed in different ways. For example, the intermediate substrate 522 can contain a redistribution layer. As a further example, the intermediate substrate 522 can be formed with the entire top surface being flat.

Also for example, the intermediate substrate 522 can be formed as a step-down substrate, which has the edges of the intermediate substrate 522 at a lower height than the top surface of the intermediate substrate 522 to help prevent mold flash from contaminating exposed contacts, such as the upper contact pads 528.

The intermediate substrate 522 formed as a step-down substrate can be formed through a number of processes such as using a saw that cuts the edge of the intermediate substrate 522 to a predetermined depth without cutting through the intermediate substrate 522. The external interconnects 504 can be formed on the upper contact pads 528 for connection to other integrated circuit devices.

The shield 524 preferably functions as an electromagnetic interference (EMI) shield and a noise suppression structure between the first integrated circuit die 506 and the second integrated circuit die 510. The shield 524 preferably includes conductive materials such as a conductive metal or conductive paste. The shield 524 has noise deterrence properties through the use of the physical properties of magnetic or inductive materials. The materials of the shield 524 preferably possess inductive properties for EMI suppression and resistive properties for EMI absorption providing an overall result of radiation attenuation.

The shield 524 can be applied to the intermediate substrate 522 by plating on the intermediate substrate 522. The shield 524 can extend to the edge of the intermediate substrate 522. The shield 524 can be deposited or plated on the via 532 which can extend through the intermediate substrate 522 and is in electrical contact with the ground contact pad 530 on the upper surface of the intermediate substrate 522. The shield 524 can be grounded by wire-bonding the ground contact pad 530 to the top contact pads 514 of the bottom substrate 502 with the bond wires 520.

It has been discovered that the shield 524 being formed as part of the interposer 508 allows for a reduction in the equipment necessary for manufacturing. For example, because the shield 524 is plated directly on the intermediate substrate 522, equipment for mounting a metal shield is unnecessary. Also for example, there is no need for additional processing to attach a metal shield such as applying an extra layer of adhesive.

The wire-in-film adhesive 526 is an adhesive applied to the shield 524 for attaching the interposer 508 to another component. The wire-in-film adhesive 526 can be used to attach the interposer 508 to the first integrated circuit die 506. The wire-in-film adhesive 526 has a low viscosity and as temperature increases the viscosity gets lower. The wire-in-film adhesive 526 can be pressed over the first integrated circuit die 506 and the bond wires 520 and then cured to harden the wire-in-film adhesive 526.

The wire-in-film adhesive 526 is a thermally conductive dielectric material. The wire-in-film adhesive 526 can be made of a B-stage material, such as a B-stage epoxy, that can be hardened after curing and can maintain a predetermined thickness. The wire-in-film adhesive 526 functions as a spacer between the first integrated circuit die 506 and the shield 524, and also serves to protect the bond wires 520 attached to the first integrated circuit die 506 from mechanical damage. The wire-in-film adhesive 526 also functions to prevent the bond wires 520 from a short by preventing them from contacting other bond wires 520 or the shield 524.

It has been discovered that the shield 524 being formed as part of the interposer 508 and attaching the interposer 508 to the first integrated circuit die 506 directly with the wire-in-film adhesive 526 allows for a reduction in height of the final package. Additionally, it has been discovered that the reduction in processing and manufacturing steps also can lead to a reduction in cost of manufacture.

Thus, it has been discovered that the integrated circuit packaging system of the present invention furnishes important and heretofore unknown and unavailable solutions, capabilities, and functional aspects for a method of manufacture of the integrated circuit packaging system with interposer shield.

The encapsulation 512 can be molded to cover the top surface of the bottom substrate 502, the first integrated circuit die 506, the interposer 508, the upper contact pads 528, and the bond wires 520. The encapsulation 512, such as film assisted molding, epoxy molding, or some type of plastic, protects sensitive components from moisture, dust and other contamination. The encapsulation 512 can be planarized so as to expose the external interconnects 504 on the upper contact pads 528 on the interposer 508 for connection to the integrated circuit device 536.

The integrated circuit device 536 can contain the second integrated circuit die 510, the bond wires 520, a device substrate 538, and a device encapsulation 540. The second integrated circuit die 510 can be mounted on the device substrate 536, wire-bonded to the device substrate 536 with bond wires 520, and covered by the device encapsulation 540.

Figure 6:
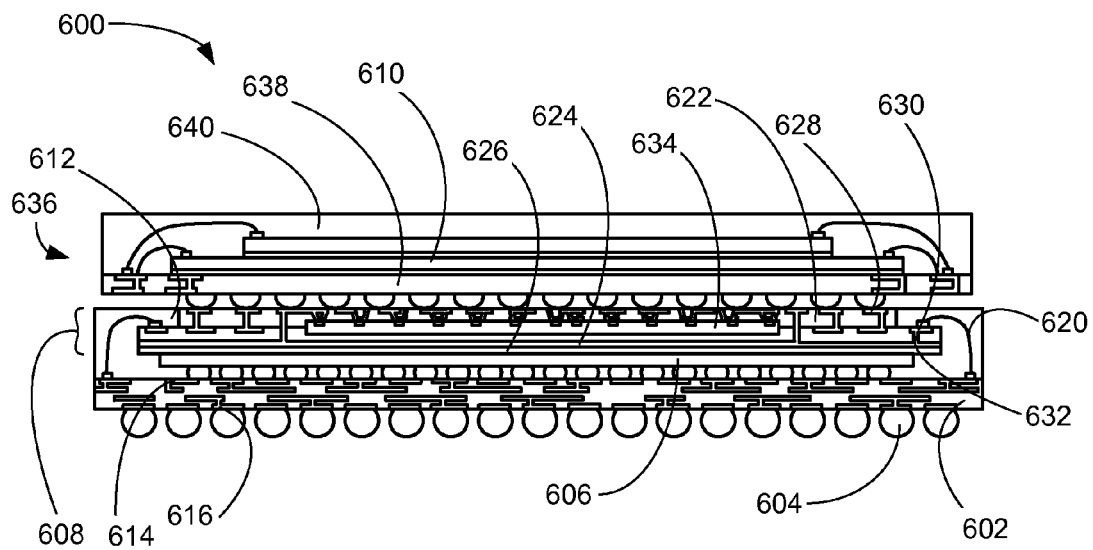
FIG. 6 is a cross-sectional view of the integrated circuit packaging system along the line 2-2 of FIG. 1 in a fifth embodiment of the present invention.

Referring now to FIG. 6, therein is shown a cross-sectional view of the integrated circuit packaging system 600 along the line 2-2 of FIG. 1 in a fifth embodiment of the present invention. The integrated circuit packaging system 600 is shown having the bottom substrate 602, such as a laminated plastic or ceramic substrate, external interconnects 604, a first integrated circuit die 606, an interposer 608, a second integrated circuit die 610, and an encapsulation 612.

The bottom substrate 602 has top contact pads 614, bottom contact pads 616, and the external interconnects 604. The bottom substrate 602 can include a conductive pattern that connects the top contact pads 614 to the bottom contact pads 616. The bottom contact pads 616 can connect to ground or to a next level system (not shown) through the external interconnects 604. The external interconnects 604 can be connectors such as solder balls formed on the bottom contact pads 616.

The first integrated circuit die 606 can be mounted on the bottom substrate 602. The first integrated circuit die 606 can be a die that emits signals such as a radio frequency (RF) die. The first integrated circuit die 606 can be mounted on the bottom substrate 602 in a number of ways. For example, the first integrated circuit die 606 can be a flip chip and mounted on the bottom substrate 602 with solder balls.

Mounted on the first integrated circuit die 606 is the interposer 608, as an example. The interposer 608 can be larger than the first integrated circuit die 606 to shield other components from EMI from the first integrated circuit die 606. The interposer 608 has an intermediate substrate 622, a shield 624 formed on the intermediate substrate 622, and a wire-in-film adhesive 626 applied to the shield 624. The interposer 608 mounted on the first integrated circuit die 606 can be used as a redistribution layer for a device mounted on the opposite side of the interposer 608 from the first integrated circuit die 606. The top contact pads 614 can directly connect to the first integrated circuit die 606 or to the interposer 608.

The interposer 608 can be manufactured in a large sheet. For example, the intermediate substrate 622 can be formed, and the shield 624 deposited on the intermediate substrate 622 by a process such as plating, sputtering, or chemical vapor deposition (CVD).

The wire-in-film adhesive 626 can be applied to the shield 624, and then the individual units of the interposer 608 can be singulated by a process such as sawing. The vertical edges of the wire-in-film adhesive 626, the shield 624, and the intermediate substrate 622 are all coplanar because of the method of manufacture.

The intermediate substrate 622 can have upper contact pads 628 on the top surface of the intermediate substrate 622 and a ground contact pad 630 that is electrically connected to a via 632 that extends through the intermediate substrate 622. The upper contact pads 628 and the ground contact pad 630 can be coplanar with the surface of the intermediate substrate 622.

The intermediate substrate 622 can be formed in different ways. For example, the intermediate substrate 622 can contain a redistribution layer. As a further example, the intermediate substrate 622 can be formed with the entire top surface being flat.

Also for example, the intermediate substrate 622 can be formed as a step-down substrate, which has the edges of the intermediate substrate 622 at a lower height than the top surface of the intermediate substrate 622 to help prevent mold flash from contaminating exposed contacts, such as the upper contact pads 628.

The intermediate substrate 622 formed as a step-down substrate can be formed through a number of processes such as using a saw that cuts the edge of the intermediate substrate 622 to a predetermined depth without cutting through the intermediate substrate 622. The external interconnects 604 can be formed on the upper contact pads 628 for connection to other integrated circuit devices.

The intermediate substrate 622 can contain an embedded die 634, which is entirely inside the intermediate substrate 622. The embedded die 634 can connect to the upper contact pads 628 through internal interconnects. The embedded die 634 can be placed in the intermediate substrate 622 during manufacture of the intermediate substrate 622 in a number of ways. For example, during manufacture of the intermediate substrate 622, a recess can be cut in the bottom layers for the embedded die 634, and then the top layers of the intermediate substrate 622 can be formed over the bottom layers and the embedded die 634.

The shield 624 preferably functions as an electromagnetic interference (EMI) shield and a noise suppression structure between the first integrated circuit die 606 and the second integrated circuit die 610. The shield 624 preferably includes conductive materials such as a conductive metal or conductive paste. The shield 624 has noise deterrence properties through the use of the physical properties of magnetic or inductive materials. The materials of the shield 624 preferably possess inductive properties for EMI suppression and resistive properties for EMI absorption providing an overall result of radiation attenuation.

The shield 624 can be applied to the intermediate substrate 622 by plating on the intermediate substrate 622. The shield 624 can extend to the edge of the intermediate substrate 622. The shield 624 can be deposited or plated on the via 632 which can extend through the intermediate substrate 622 and is in electrical contact with the ground contact pad 630 on the upper surface of the intermediate substrate 622. The shield 624 can be grounded by wire-bonding the ground contact pad 630 to the top contact pads 614 of the bottom substrate 602 with the bond wires 620.

It has been discovered that the shield 624 being formed as part of the interposer 608 allows for a reduction in the equipment necessary for manufacturing. For example, because the shield 624 is plated directly on the intermediate substrate 622, equipment for mounting a metal shield is unnecessary. Also for example, there is no need for additional processing to attach a metal shield such as applying an extra layer of adhesive.

The wire-in-film adhesive 626 is an adhesive applied to the shield 624 for attaching the interposer 608 to another component. The wire-in-film adhesive 626 can be used to attach the interposer 608 to the first integrated circuit die 606. The wire-in-film adhesive 626 has a low viscosity and as temperature increases the viscosity gets lower. The wire-in-film adhesive 626 can be pressed over the first integrated circuit die 606 and the bond wires 620 and then cured to harden the wire-in-film adhesive 626.

The wire-in-film adhesive 626 is a thermally conductive dielectric material. The wire-in-film adhesive 626 can be made of a B-stage material, such as a B-stage epoxy, that can be hardened after curing and can maintain a predetermined thickness. The wire-in-film adhesive 626 functions as a spacer between the first integrated circuit die 606 and the shield 624, and also serves to protect the bond wires 620 attached to the first integrated circuit die 606 from mechanical damage. The wire-in-film adhesive 626 also functions to prevent the bond wires 620 from a short by preventing them from contacting other bond wires 620 or the shield 624.

It has been discovered that the shield 624 being formed as part of the interposer 608 and attaching the interposer 608 to the first integrated circuit die 606 directly with the wire-in-film adhesive 626 allows for a reduction in height of the final package. Additionally, it has been discovered that the reduction in processing and manufacturing steps also can lead to a reduction in cost of manufacture.

Thus, it has been discovered that the integrated circuit packaging system of the present invention furnishes important and heretofore unknown and unavailable solutions, capabilities, and functional aspects for a method of manufacture of the integrated circuit packaging system with interposer shield.

The encapsulation 612 can be molded to cover the top surface of the bottom substrate 602, the first integrated circuit die 606, the interposer 608, the upper contact pads 628, and the bond wires 620. The encapsulation 612, such as film assisted molding, epoxy molding, or some type of plastic, protects sensitive components from moisture, dust and other contamination. The encapsulation 612 can be molded leaving the upper contact pads 628 of the interposer 608 exposed for external connection to another device such as the integrated circuit device 636.

The integrated circuit device 636 can contain the second integrated circuit die 610, the bond wires 620, a device substrate 638, and a device encapsulation 640. The second integrated circuit die 610 can be mounted on the device substrate 636, wire-bonded to the device substrate 638 with bond wires 620, and covered by the device encapsulation 640.

Figure 7:
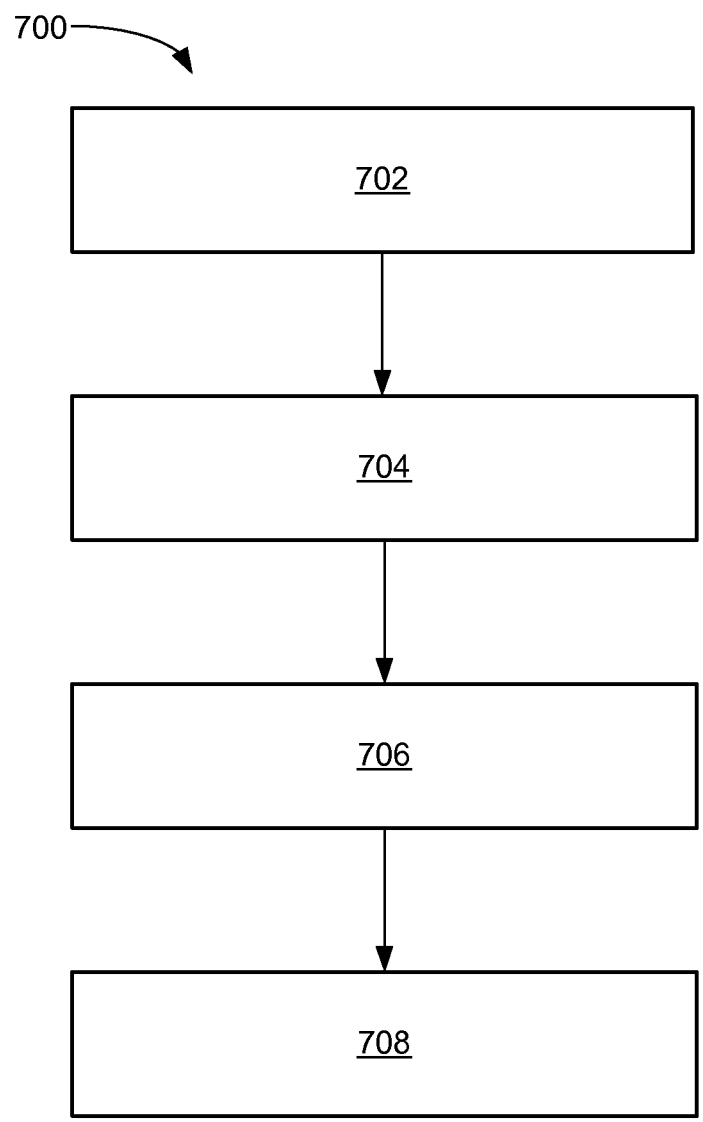
FIG. 7 is a flow chart of a method of manufacture of the integrated circuit packaging system in an embodiment of the present invention.

Referring now to FIG. 7, therein is shown a flow chart of a method 700 of manufacture of an integrated circuit packaging system in an embodiment of the present invention. The method 700 includes: providing a bottom substrate in a block 702; attaching a first integrated circuit die to the bottom substrate in a block 704; forming an interposer including: forming an intermediate substrate, forming a shield on the intermediate substrate, and applying a wire-in-film adhesive to the shield in a block 706; and attaching the interposer to the first integrated circuit die with the wire-in-film adhesive in a block 708.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies. Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a bottom substrate;
    attaching a first integrated circuit die to the bottom substrate;
    forming an interposer including:
        providing an intermediate substrate, the intermediate substrate is a step-down substrate,
        depositing a shield directly on the intermediate substrate, the shield is connectible through the intermediate substrate to a ground and the shield is a conductive paste of inductive material for forming an electromagnetic interference and noise suppression structure, and
        applying an adhesive to the shield;
    attaching the interposer to the first integrated circuit die with the adhesive;
    molding a first encapsulation over the interposer, the first encapsulation completely covering vertical sides of the step-down substrate;
    forming contact pads on the interposer;
    providing an upper substrate having a top surface and a bottom surface;
    attaching a second integrated circuit die to the top surface of the upper substrate;
    forming interconnects on the bottom surface of the upper substrate;
    attaching the upper substrate to the interposer such that the interconnects and the contact pads form electrical connections; and
    molding a second encapsulation over the upper substrate, the second encapsulation covering the second integrated circuit die.

2. The method as claimed in claim 1 wherein providing the bottom substrate includes providing the bottom substrate having a top contact pad on a top surface of the bottom substrate, and a bottom contact pad on a bottom surface of the bottom substrate; and further comprising:
    forming an external interconnect on the bottom contact pad of the bottom substrate.

3. The method as claimed in claim 1 wherein forming the interposer includes:
    forming a ground contact pad on a top surface of the intermediate substrate;
    forming a via connected to the ground contact pad; and
    forming the shield on the intermediate substrate and the via.

4. The method as claimed in claim 1 further comprising:
    connecting with a bond wire the interposer and the bottom substrate.

5. A method of manufacture of an integrated circuit packaging system comprising:
    providing a bottom substrate;
    attaching a first integrated circuit die to the bottom substrate;
    forming an interposer including:
        providing an intermediate substrate, the intermediate substrate is a step-down substrate,
        depositing a shield directly on the intermediate substrate, the shield is connectible through the intermediate substrate to a ground and the shield is a conductive paste of inductive material for forming an electromagnetic interference and noise suppression structure, and
        applying an adhesive to the shield;
    attaching the interposer to the first integrated circuit die with the adhesive;
    connecting the interposer and the bottom substrate with a first bond wire;
    mounting a second integrated circuit die over the interposer;
    molding an encapsulation over the interposer, the encapsulation completely covering vertical sides of the step-down substrate;
    mounting a second integrated circuit die over the interposer; and
    connecting the second integrated circuit die and the interposer with a second bond wire.

6. The method as claimed in claim 5 wherein attaching the first integrated circuit die includes attaching with a die attach adhesive the first integrated circuit die to the bottom substrate.

7. The method as claimed in claim 5 wherein providing the intermediate substrate includes forming the intermediate substrate with an embedded die in the intermediate substrate.

8. The method as claimed in claim 5 wherein providing the intermediate substrate includes forming a redistribution layer on the intermediate substrate.

9. The method as claimed in claim 5 wherein molding the encapsulation includes molding the encapsulation over the first integrated circuit die, and a top surface of the bottom substrate.

10. An integrated circuit packaging system comprising:
- a bottom substrate;
- a first integrated circuit die attached to the bottom substrate;
- an interposer mounted on the first integrated circuit die with an adhesive, the interposer having an intermediate substrate, the intermediate substrate is a step-down substrate, a shield directly on the intermediate substrate, the shield is connectible through the intermediate substrate to a ground and the shield is a conductive paste of inductive material for forming an electromagnetic interference and noise suppression structure, and the adhesive between the first integrated circuit die and the shield;
- a first encapsulation over the interposer, the first encapsulation completely covering vertical sides of the step-down substrate;
- contact pads formed on the interposer;
- an upper substrate having a top surface and a bottom surface;
- a second integrated circuit die attached to the top surface of the upper substrate;
- interconnects formed on the bottom surface of the upper substrate, wherein the upper substrate is coupled to the interposer such that the interconnects and the contact pads form electrical connections; and
- a second encapsulation over the upper substrate, the second encapsulation covering the second integrated circuit die.

11. The system as claimed in claim 10 wherein the bottom substrate includes:
- a top contact pad on a top surface of the bottom substrate;
- a bottom contact pad on a bottom surface of the bottom substrate; and further comprising:
- an external interconnect on the bottom contact pad of the bottom substrate.

12. The system as claimed in claim 10 wherein the interposer includes:
- a ground contact pad on a top surface of the intermediate substrate; and
- a via connecting the ground contact pad and the shield.

13. The system as claimed in claim 10 further comprising a bond wire between the interposer and the bottom substrate.

14. The system as claimed in claim 10 further comprising:
- an external interconnect on the bottom contact pad of the bottom substrate.

15. The system as claimed in claim 14 further comprising a die attach adhesive on and between the first integrated circuit die and the bottom substrate.

16. The system as claimed in claim 14 wherein the intermediate substrate includes an embedded die in the intermediate substrate.

17. The system as claimed in claim 14 wherein the intermediate substrate includes a redistribution layer.

18. The system as claimed in claim 14 wherein the first encapsulation is on the first integrated circuit die, and the top surface of the bottom substrate.

* * * * *